(12) United States Patent
McSherry et al.

(10) Patent No.: US 8,701,067 B1
(45) Date of Patent: Apr. 15, 2014

(54) METHODS, SYSTEMS, AND ARTICLES OF MANUFACTURES FOR IMPLEMENTING ELECTRONIC CIRCUIT DESIGNS WITH IR-DROP AWARENESS

(75) Inventors: Michael McSherry, Portland, OR (US); Bruce Yanagida, Snohomish, WA (US); Ed Fischer, Salem, OR (US); David White, San Jose, CA (US); Prakash Krishnan, Wayne, NJ (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/189,274

(22) Filed: Jul. 22, 2011

Related U.S. Application Data

(60) Provisional application No. 61/367,398, filed on Jul. 24, 2010, provisional application No. 61/367,412, filed on Jul. 24, 2010, provisional application No. 61/367,404, filed on Jul. 24, 2010, provisional application No. 61/367,406, filed on Jul. 24, 2010, provisional application No. 61/367,407, filed on Jul. 24, 2010, provisional application No. 61/367,410, filed on Jul. 24, 2010.

(51) Int. Cl.
*G06F 17/50* (2006.01)

(52) U.S. Cl.
USPC ............ 716/112; 716/115; 716/132; 716/136

(58) Field of Classification Search
USPC .......................... 716/110–112, 115, 132, 136
See application file for complete search history.

(56) References Cited

U.S. PATENT DOCUMENTS

| | | | |
|---|---|---|---|
| 4,817,012 A | 3/1989 | Cali' | |
| 5,469,366 A * | 11/1995 | Yang et al. | ................... 716/113 |
| 5,553,002 A | 9/1996 | Dangelo et al. | |
| 5,629,857 A | 5/1997 | Brennan | |
| 5,872,952 A | 2/1999 | Tuan et al. | |
| 5,999,726 A | 12/1999 | Ho | |
| 6,072,945 A | 6/2000 | Aji et al. | |
| 6,131,182 A | 10/2000 | Beakes et al. | |
| 6,378,110 B1 | 4/2002 | Ho | |
| 6,438,729 B1 | 8/2002 | Ho | |
| 6,449,578 B1 | 9/2002 | McBride | |
| 6,470,482 B1 | 10/2002 | Rostoker et al. | |
| 6,507,932 B1 | 1/2003 | Landry et al. | |

(Continued)

OTHER PUBLICATIONS

International Search Report and Written Opinion dated Sep. 16, 2011 for PCT App. No. PCT/US11/45119.

(Continued)

*Primary Examiner* — Naum Levin
(74) *Attorney, Agent, or Firm* — Vista IP Law Group, LLP

(57) ABSTRACT

Disclosed are a method, system, and computer program product for implementing electronic circuit designs with IR-drop awareness. Some embodiments perform schematic level simulation(s) to determine electrical characteristics, identifies physical parasitics of a layout component, determines the electrical or physical characteristics associated to IR-drop analysis on the component, and determines whether the component meets IR-drop related constraint(s) while implementing the physical design of the electronic circuit in some embodiments. Some embodiments further determine adjustment(s) to the component or related data where the IR-drop related constraints are not met and/or and present the adjustment(s) in the form of hints. Various data and information, such as currents in various forms or voltages, are passed between various schematic level tools and physical level tools.

20 Claims, 11 Drawing Sheets

(56) References Cited

U.S. PATENT DOCUMENTS

| | | |
|---|---|---|
| 6,523,150 B1 * | 2/2003 | Buffet et al. ............... 716/112 |
| 6,539,533 B1 | 3/2003 | Brown et al. |
| 6,553,554 B1 | 4/2003 | Dahl et al. |
| 6,584,606 B1 * | 6/2003 | Chiu et al. ................. 716/112 |
| 6,643,836 B2 | 11/2003 | Wheeler et al. |
| 6,665,845 B1 | 12/2003 | Aingaran et al. |
| 6,701,508 B1 | 3/2004 | Bartz et al. |
| 6,842,714 B1 * | 1/2005 | Acar et al. ................. 702/136 |
| 6,877,148 B1 | 4/2005 | Hassibi et al. |
| 6,910,200 B1 | 6/2005 | Aubel et al. |
| 6,954,915 B2 | 10/2005 | Batchelor |
| 6,971,074 B2 | 11/2005 | Hasegawa et al. |
| 6,981,238 B1 | 12/2005 | Churchill |
| 7,016,794 B2 * | 3/2006 | Schultz ....................... 702/64 |
| 7,020,853 B2 | 3/2006 | Skoll et al. |
| 7,069,526 B2 | 6/2006 | Schubert et al. |
| 7,076,410 B1 | 7/2006 | Kerzman et al. |
| 7,089,129 B2 | 8/2006 | Habitz |
| 7,152,215 B2 | 12/2006 | Smith et al. |
| 7,159,202 B2 | 1/2007 | Lee et al. |
| 7,178,118 B2 | 2/2007 | Ramachandran et al. |
| 7,181,383 B1 | 2/2007 | McGaughy et al. |
| 7,206,731 B2 | 4/2007 | Sercu et al. |
| 7,228,514 B2 | 6/2007 | Chan et al. |
| 7,243,317 B2 | 7/2007 | Wang et al. |
| 7,251,800 B2 | 7/2007 | McElvain et al. |
| 7,278,120 B2 * | 10/2007 | Rahmat et al. ............. 716/111 |
| 7,331,029 B2 | 2/2008 | Amit et al. |
| 7,347,621 B2 | 3/2008 | Sri-Jayantha et al. |
| 7,356,784 B1 | 4/2008 | Dengi et al. |
| 7,383,521 B2 * | 6/2008 | Smith et al. ................ 716/114 |
| 7,395,519 B2 | 7/2008 | Kawata |
| 7,559,045 B2 | 7/2009 | Chen et al. |
| 7,567,894 B2 | 7/2009 | Durand et al. |
| 7,574,682 B2 | 8/2009 | Riviere-Cazaux |
| 7,596,771 B2 | 9/2009 | Cohen et al. |
| 7,640,527 B1 | 12/2009 | Doraira et al. |
| 7,797,646 B2 | 9/2010 | Chung et al. |
| 7,802,222 B2 | 9/2010 | Arsintescu |
| 7,805,698 B1 | 9/2010 | Ferguson et al. |
| 7,810,063 B1 | 10/2010 | Sharma et al. |
| 7,818,697 B2 | 10/2010 | Cho |
| 7,904,852 B1 | 3/2011 | Cadouri et al. |
| 7,941,768 B1 | 5/2011 | Wei |
| 7,966,588 B1 * | 6/2011 | Perry et al. ................. 716/100 |
| 8,141,013 B2 | 3/2012 | Woods et al. |
| 8,150,638 B1 | 4/2012 | Wu et al. |
| 8,185,856 B2 | 5/2012 | Izuha |
| 8,224,636 B2 | 7/2012 | Kundert |
| 8,261,228 B1 | 9/2012 | Gopalakrishnan et al. |
| 2002/0166102 A1 | 11/2002 | Du et al. |
| 2003/0131323 A1 | 7/2003 | McConaghy |
| 2004/0049747 A1 | 3/2004 | Yamasaki et al. |
| 2004/0078767 A1 | 4/2004 | Burks et al. |
| 2004/0117748 A1 | 6/2004 | Tester |
| 2004/0117750 A1 | 6/2004 | Skoll et al. |
| 2004/0128368 A1 | 7/2004 | Sakai |
| 2004/0128638 A1 | 7/2004 | Kerzman et al. |
| 2004/0143809 A1 | 7/2004 | Cowan et al. |
| 2004/0243949 A1 | 12/2004 | Wang et al. |
| 2005/0010922 A1 | 1/2005 | Czajkowski et al. |
| 2005/0114818 A1 | 5/2005 | Khakzadi et al. |
| 2005/0216873 A1 | 9/2005 | Singh et al. |
| 2005/0268258 A1 | 12/2005 | Decker |
| 2005/0268269 A1 | 12/2005 | Coiley |
| 2005/0273732 A1 | 12/2005 | Xu et al. |
| 2005/0278665 A1 | 12/2005 | Gentry et al. |
| 2006/0095884 A1 | 5/2006 | Skoll et al. |
| 2006/0095889 A1 | 5/2006 | Cote et al. |
| 2006/0101368 A1 | 5/2006 | Kesarwani et al. |
| 2006/0123364 A1 | 6/2006 | Cook et al. |
| 2007/0094622 A1 | 4/2007 | Lee et al. |
| 2007/0106969 A1 | 5/2007 | Birch et al. |
| 2007/0118827 A1 | 5/2007 | Rahman |
| 2007/0234266 A1 | 10/2007 | Chen et al. |
| 2007/0245274 A1 | 10/2007 | Kimura |
| 2007/0299647 A1 | 12/2007 | Bolcato et al. |
| 2008/0022251 A1 | 1/2008 | McConaghy et al. |
| 2008/0133201 A1 | 6/2008 | Guedon |
| 2008/0148195 A1 | 6/2008 | Chan et al. |
| 2008/0209365 A1 | 8/2008 | Riviere-Cazaux |
| 2008/0244497 A1 | 10/2008 | Zhao et al. |
| 2008/0244498 A1 | 10/2008 | Gupta et al. |
| 2009/0019411 A1 | 1/2009 | Chandra et al. |
| 2009/0031261 A1 | 1/2009 | Smith et al. |
| 2009/0089733 A1 | 4/2009 | Chang et al. |
| 2009/0144042 A1 | 6/2009 | Lorenz et al. |
| 2009/0150842 A1 | 6/2009 | Kemerer et al. |
| 2009/0254874 A1 | 10/2009 | Bose |
| 2009/0265672 A1 | 10/2009 | St. John et al. |
| 2010/0083200 A1 | 4/2010 | Song et al. |
| 2010/0217577 A1 | 8/2010 | Korobkov et al. |
| 2011/0107293 A1 | 5/2011 | Ganzhorn et al. |
| 2011/0197170 A1 | 8/2011 | Chandramohan et al. |
| 2011/0314437 A1 | 12/2011 | Mcilrath |
| 2012/0022846 A1 * | 1/2012 | White et al. ................. 703/14 |
| 2012/0023465 A1 * | 1/2012 | Gopalakrishnan et al. ... 716/102 |
| 2012/0023467 A1 * | 1/2012 | McSherry et al. ........... 716/112 |
| 2012/0117530 A1 | 5/2012 | Green |

OTHER PUBLICATIONS

International Search Report and Written Opinion dated Sep. 16, 2011 for PCT App. No. PCT/US11/45110.
International Search Report and Written Opinion dated Sep. 22, 2011 for PCT App. No. PCT/US11/45126.
International Search Report and Written Opinion dated Sep. 22, 2011 for PCT App. No. PCT/US11/45123.
International Search Report and Written Opinion dated Dec. 9, 2011 for PCT App. No. PCT/US11/45104.
International Search Report and Written Opinion dated Dec. 7, 2011 for PCT App. No. PCT/US11/45091.
Non-Final Office Action dated Jun. 15, 2012 for U.S. Appl. No. 12/982,822.
Non-Final Office Action dated Jun. 12, 2012 for U.S. Appl. No. 12/982,628.
Non-Final Offiec Action dated Sep. 21, 2012 for U.S. Appl. No. 12/982,721.
Notice of Allowance dated Nov. 14, 2012 for U.S. Appl. No. 12/982,628.
Final Office Action dated Nov. 13, 2012 for U.S. Appl. No. 12/982,822.
Non-Final Office Action dated Oct. 3, 2012 for U.S. Appl. No. 12/982,732.
T. Quarles, "SPICE3 Version 3f3 User's Manual", May 1993.
Final Office Action dated Feb. 19, 2013 for U.S. Appl. No. 12/982,732.
Non-Final Office Action dated Jan. 18, 2013 for U.S. Appl. No. 12/982,790.
Final Office Action dated Apr. 4, 2013 for U.S. Appl. No. 12/982,721.
Final Office Action dated May 2, 2013 for U.S. Appl. No. 12/982,790.
Non-Final Office Action dated Aug. 6, 2013 for U.S. Appl. No. 12/982,732.
Non-Final Office Action dated Jun. 24, 2013 for U.S. Appl. No. 12/982,762.
Final Office Action dated Dec. 17, 2013 for U.S. Appl. No. 12/982,762.
Notice of Allowance dated Dec. 9, 2013 for U.S. Appl. No. 12/982,732.

* cited by examiner

FIG. 1A
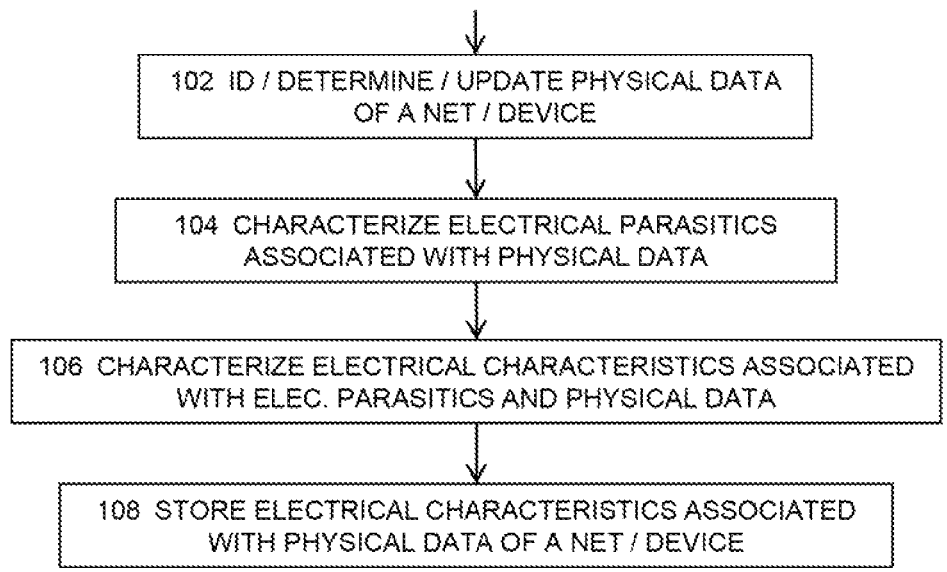
FIG. 1B
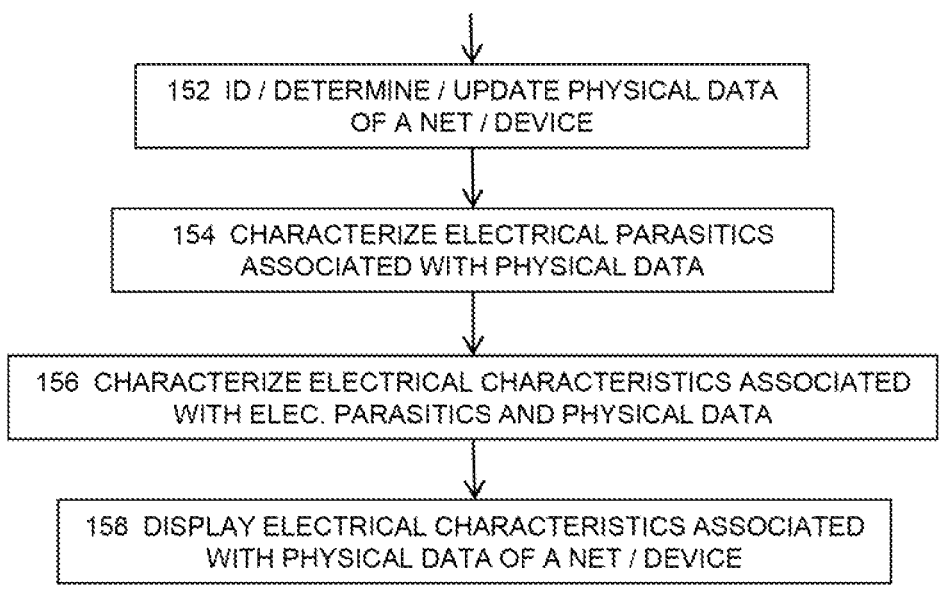

METHODS, SYSTEMS, AND ARTICLES OF MANUFACTURES FOR IMPLEMENTING ELECTRONIC CIRCUIT DESIGNS WITH IR-DROP AWARENESS

CROSS-REFERENCE TO RELATED APPLICATION(S)

This application claims the benefit of U.S. Provisional App. Ser. No. 61/367,398, filed on Jul. 24, 2010 and entitled "METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS", U.S. Provisional App. Ser. No. 61/367,412, filed on Jul. 24, 2010 and entitled "METHODS, SYSTEMS, AND ARTICLES OF MANUFACTURE FOR IMPLEMENTING ELECTRONIC CIRCUIT DESIGNS WITH ELECTRICAL AWARENESS", U.S. Provisional App. Ser. No. 61/367,404, filed on Jul. 24, 2010 and entitled "METHODS, SYSTEMS, AND ARTICLES OF MANUFACTURE FOR IMPLEMENTING ELECTRONIC CIRCUIT DESIGNS WITH ELECTRO-MIGRATION AWARENESS", U.S. Provisional App. Ser. No. 61/367,406, filed on Jul. 24, 2010 and entitled "METHODS, SYSTEMS, AND ARTICLES OF MANUFACTURE FOR IMPLEMENTING ELECTRONIC CIRCUIT DESIGNS WITH IR-DROP AWARENESS", U.S. Provisional App. Ser. No. 61/367,407, filed on Jul. 24, 2010 and entitled "METHODS, SYSTEMS, AND ARTICLES OF MANUFACTURE FOR IMPLEMENTING ELECTRONIC CIRCUIT DESIGNS WITH SIMULATION AWARENESS", and U.S. Provisional App. Ser. No. 61/367,410, filed on Jul. 24, 2010 and entitled "METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS". The entire contents of the aforementioned applications are hereby expressly incorporated by reference in their entirety.

This application is related to U.S. patent application Ser. No. 12/982,721, entitled "METHODS, SYSTEMS, AND ARTICLES OF MANUFACTURES FOR IMPLEMENTING ELECTRONIC CIRCUIT DESIGNS WITH ELECTRICAL AWARENESS" and filed on Dec. 30, 2010, U.S. patent application Ser. No. 12/982,762, entitled "METHODS, SYSTEMS, AND ARTICLES OF MANUFACTURES FOR IMPLEMENTING ELECTRONIC CIRCUIT DESIGNS WITH ELECTRO-MIGRATION AWARENESS" and filed on Dec. 30, 2010, U.S. patent application Ser. No. 12/982,790, entitled "METHODS, SYSTEMS, AND ARTICLES OF MANUFACTURES FOR IMPLEMENTING ELECTRONIC CIRCUIT DESIGNS WITH SIMULATION AWARENESS" and filed on Dec. 30, 2010, U.S. patent application Ser. No. 12/982,628, entitled "METHOD, APPARATUS, AND ARTICLE OF MANUFACTURES FOR PROVIDING IN SITU, CUSTOMIZABLE INFORMATION IN DESIGNING ELECTRONIC CIRCUITS WITH ELECTRICAL AWARENESS" and filed on Dec. 30, 2010, and U.S. patent application Ser. No. 12/982,732, entitled "METHODS, SYSTEMS, AND ARTICLES OF MANUFACTURES FOR CONSTRAINT VERIFICATION FOR IMPLEMENTING ELECTRONIC CIRCUIT DESIGNS WITH ELECTRICAL AWARENESS" and filed on Dec. 30, 2010, and U.S. patent application Ser. No. 12/982,822, entitled "METHOD, APPARATUS, AND ARTICLE OF MANUFACTURES FOR PROVIDING IN SITU, CUSTOMIZABLE INFORMATION IN DESIGNING ELECTRONIC CIRCUITS WITH ELECTRICAL AWARENESS" and filed on Dec. 30, 2010. The entire disclosures of the above applications are hereby expressly incorporated by reference in their entireties in the instant Application.

BACKGROUND

Voltage drop, also called IR drop, is the voltage reduction that occurs on power supply networks. The IR drop may be static or dynamic and results from the existence of non-ideal elements—the resistance within the power and ground supply wiring and the capacitance between them. While static voltage drop considers only the average currents, dynamic voltage drop considers current waveforms within clock cycles and has an RC transient behavior. Similar effects may be found in ground wiring, usually referred as ground bounce, whereby current flows back to the ground/$V_{ss}$ pins causing its voltage to fluctuate. Both effects contribute to lower operating voltages within devices (e.g., logic cells/gates in digital circuits), which in general increases the overall time response of a device and might cause operational failures.

The recent advances in very deep sub-micron (VDSM) integrated circuits (ICs) have brought new challenges in the physical design methodology process of integrated systems. In modern electronic circuits, geometries become smaller; clock frequencies increase; and on-chip interconnections gain increased importance in the prediction of performance. Nonetheless, it has been found that from 0.13 µm and bellow, ICs are more susceptible to IR drop, which requires some degree of built-in fault-tolerance and a careful design planning. Meanwhile, increased power demanded on ever shrunk chip size further exacerbates the problem because a significant number of devices may become active in a short period of time and drawing current from close regions of the power grid.

Unfortunately, most conventional electronic circuit design tools focus on post-layout verification of the power grid when the entire chip design is complete and detailed information about the parasitics of the physical designs and the currents drawn by the transistors are known. IR drop problems revealed at this stage are usually very difficult or expensive to fix so the conventional methodologies help to design an initial electronic design and refine it iteratively at various design stages. In other words, the conventional circuit synthesis step is followed by layout synthesis and each step is carried out independent of the other. This is again followed by a physical or formal verification step to check whether the desired performance goals have been achieved after layout generation and extraction. These steps are carried out iteratively in such conventional approaches till the desired performance goals are met.

Thus, there exists a need for implementing electronic circuit designs with IR-drop awareness early in the design stage.

SUMMARY

What is disclosed is a method, a system, and a computer program product for implementing electronic circuit designs with IR-drop awareness. In various embodiments, the method or the system for implementing electronic circuit designs with IR-drop awareness comprises the process or module for identifying, determining, or updating physical data of a net, a device, or a component of a physical design of the electronic circuit. In some device, the method or the system further comprises the process or module for characterizing one or more electrical parasitics that are associated with the physical data.

In some embodiments, the method or the system for implementing electronic circuit designs with IR-drop awareness may further comprise the process or module for identifying or determining one or more IR-drop related constraints that are associated with one or more electrical characteristics, etc. The method or the system may also optionally comprise the process or module for ensuring correctness of the physical data and/or other data that are related to the one or more IR-drop related constraints in some embodiments.

In some embodiments where at least one of the one or more IR-drop related constraints is not met, the method or the system may further optionally comprise the process or module for determining or computing one or more adjustments for the physical data, the net(s), and/or the device(s) and/or providing hint(s) to correct the physical data. Some embodiments may further comprise the process or module for checking to ensuring that the one or more adjustments for the physical data do not violate or cause conflict with other design rules, constraints, or other issues, etc. Some embodiments may further comprise automatic or assisted application of the one or more adjustments to fix or repair the physical data. More description of the aforementioned processes or modules will be further described in greater details in the subsequent paragraphs with reference to various figures.

BRIEF DESCRIPTION OF THE DRAWINGS

The drawings illustrate the design and utility of various embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 1A-B illustrate top level diagrams for implementing various embodiments of the methods or systems for implementing electronic circuit design with IR-drop awareness.

DETAIL DESCRIPTION

Figure 2:
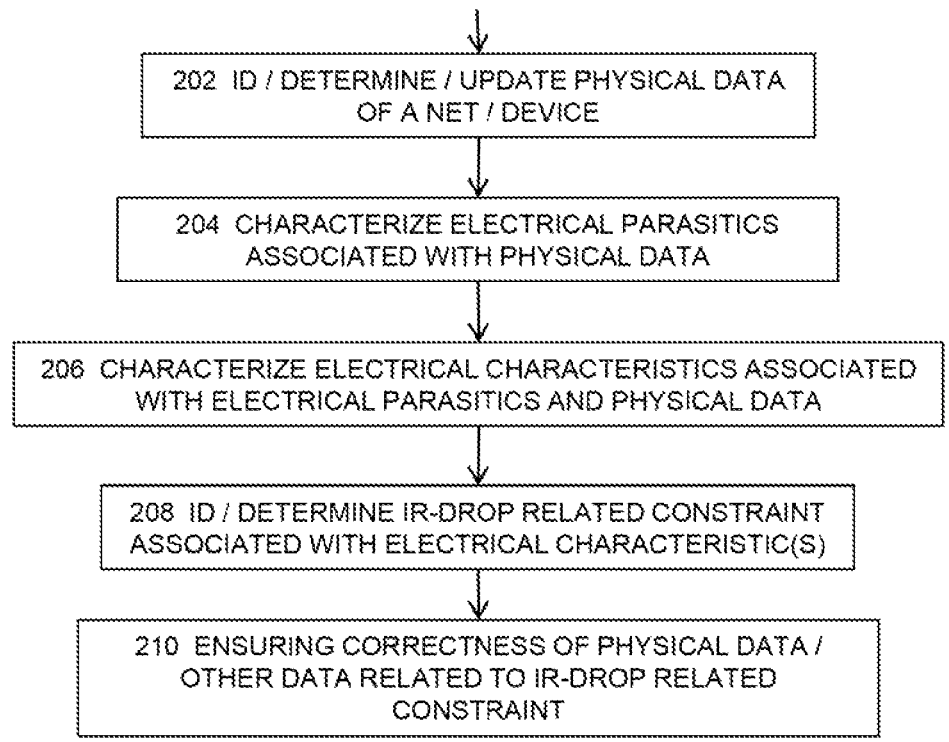
FIG. 2 illustrates a more detailed diagram for the method or system for implementing electronic circuit design with IR-drop awareness and some detailed information about the process or module for characterizing one or more electrical characteristics that are associated with electrical parasitics in some embodiments.
Figure 2:
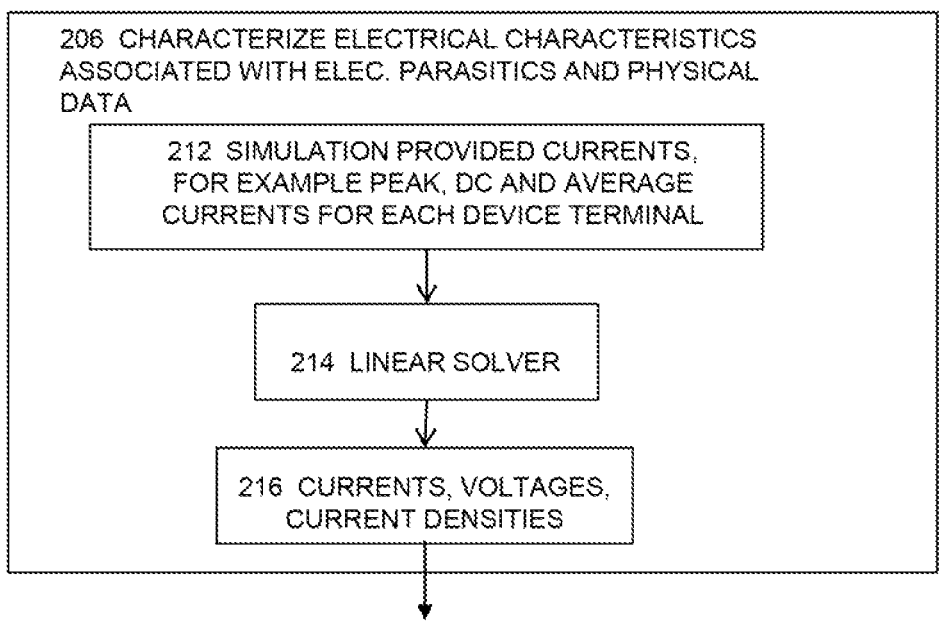

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, the present invention encompasses present and future known equivalents to the components referred to herein by way of illustration.

Characterization of an electrical characteristic or a device parameter (collectively "electrical parasitic" or simply "parasitic") may be performed to determine the current and voltage characteristics of the created or modified physical data, such as interconnect wires, via or via clusters. The interconnect structures may be part of signal or power nets. This characterization is not limited to interconnect in that physical design creation and modification of devices may impact device parasitics such as gate to contact capacitance or gate related fringe capacitance. Also one device in the schematic may be represented in the layout as multiple devices, e.g. multi-fingered devices, where a single terminal current on the schematic is actually multiple currents to each finger.

Generally, a schematic circuit is created and simulated to determine the electrical characteristics of the circuit. In the approach described herein this may be done any time prior to solving for the electrical characteristics of the physical design. Simulation is often done upon completion of the schematic and in this flow that data may be stored in a database for retrieval later. The simulation is operated at particular corners and analysis points, such as temperature, and the same settings are used during parasitic extraction. In one embodiment, the parasitic extraction or the determination of electrical characteristics may be performed in memory as one or more layout shapes or nets are created or modified.

For IR drop analysis of power grids, both the non-linear devices and linear interconnect components of the circuit must be accounted for during simulation. However due to the large size of the power grid, it is usually not efficient to solve the complete nonlinear circuit and distribution network simultaneously within the circuit simulator. As such, methods have been created to decouple the nonlinear and linear elements of the overall circuit to enable a more efficient solution.

The most common approach simulates the non-linear devices and models the power sources and drains as a constant voltage source and power drains respectively.

In the second step, electrical parasitics (e.g. resistance (R), inductance (L), or capacitance (C)) may be computed for any physical design object or set of objects to re-simulate the design. The system monitors and tracks all design changes and applies resistance and capacitance models. The set of partial objects may form a partial layout. The preferred embodiment is that parasitics may be generated interactively as physical design objects are created or modified. The data is stored for use with subsequent electrical analysis and may additionally be displayed in parasitic form. The parasitics may be displayed as function of a wire object or segment, a full net or in the case of capacitance the interaction with other nets may be shown. In some embodiments, thermal maps where the estimated operating temperature varies across a device may be applied locally to estimate the correct parasitic elements.

In the third step, the current and voltage information is then used with the RC parasitic data to solve the power network as a linear system using direct (e.g. Cholesky) or iterative (e.g. Conjugate Gradient) techniques.

For DC (direct current) analysis the resulting linear formulation for IR drop uses only resistance/conductance and contains no capacitors. The resulting equation:

$$G \cdot \bar{v} = \bar{i}$$

where G is the matrix of conductance values, v is the vector of node voltages and i is the vector of independent sources is solved using a linear solver employing direct or indirect methods. For example, Cholesky factorization may be used to separate the conductance matrix into a product of lower and upper triangular matrices and then forward and back substitution may be used to solve for the voltages throughout the network. In some embodiments, the aforementioned method followed by forward and backward substitution may be used to produce a vector of currents where each vector element represents a point in time, associated with each sample from the current waveform. For example, the aforementioned method may be used to compute RMS (root mean square) values, using the current waveforms produced by the linear solver for each part of the net.

In the aforementioned approach, the device related simulation parameters may be done during the schematic creation stage prior to physical design. The only requirement is that it be done prior to any linear solver being employed. During physical design, the electrical parasitics (e.g. R,L,C) are computed as the each physical data object/net is created or invoked manually as a set of physical data objects/nets are created.

Another approach uses the electrical parasitics associated with any physical design object or set of objects to re-simulate the design. The set of partial objects may also form a partial layout. In this approach the parasitics may need to be mapped to the schematic representation or stitched into the schematic. The parasitics may also be reduced a form that allows for faster simulation. The simulation parameters such as temperature are matched with that used for extraction. The simulator provides parasitic aware set of voltages and currents that are used for static or transient IR drop checks in subsequent steps. One embodiment is where simulation or re-simulation of the layout parasitics may be done in conjunction with IR-drop analysis or vice versa so that any impact of the interconnect may be addressed before the layout is completed.

For each physical data object, e.g. an element of the power grid, the resulting voltage drop may be compared to pre-set limits or mathematical expressions. When the limits are exceeded then the user may be notified through a graphical user interface. When the IR drop associated with a physical data, e.g. wire segment, is exceeded, the physical geometries, e.g. wire width, of the data object may be computed such the limit is not exceeded. These changes may be displayed as a hint to the user for manual fixing or the changes may be made automatically.

The IR drop checking flow may be used as part of the manual or automatic routing or post-route optimization of a design, for example during design of a block or integration activity. In this flow each route is created, checked for IR drop correctness and if necessary corrected before moving to the next route. The IR drop checking flow may be combined with current, voltage, resistance or capacitance constraints created prior to physical design.

FIG. 1A illustrates a top level diagram for implementing various embodiments of the methods or systems for implementing electronic circuit design with IR-drop awareness. In one or more embodiments, the methods or systems for implementing electronic circuit design with IR-drop awareness comprises the process or the hardware module for identifying, determining, or updating the physical data of a component or a part thereof, a device, a cell, a net, or a portion of a physical layout (hereinafter a component) of an electronic circuit design at 102 via a terminal, a work station, a computing node, or a server 100.

In some embodiments, the process for identifying, determining, or updating physical data of a component of an electronic circuit physical design may be invoked from within a physical design tool or flow, such as a layout editor, while the designer is implementing or modifying the physical design of the electronic circuit rather than from a post-layout verification tool or flow in one or more embodiments. In some embodiments, device recognition and connectivity tasks are performed to able to map electrical characteristics such as current at a given terminal with the proper nets attached to that terminal. In some embodiments; connectivity can be directed to traverse the nets hierarchically and stop on levels determined by the user.

In some embodiments, the physical data may be related to a net, which comprises one or more wires or interconnects connecting various other components together in an electronic circuit design. In some embodiment, the physical data may be related to a single component in the physical design (e.g., a layout) of the electronic circuit. In some embodiments, the physical data may be related to a device, which comprises a component that comprises a source and a drain. A device may comprise, for example, a field-effect transistor. In this example, the physical data may comprise the description of physical device layers and geometric descriptions that define the gate, source and drain regions. In various embodiments, the physical data may further comprise the material and its associated physical (e.g., physical or electrical) attributes. In various embodiments, the method or system may characterize shapes associated with a net and need to determine connectivity to identify one net from another.

In various embodiments, the method or system may characterize one or more shapes associated with a net and need to determine connectivity to identify or distinguish one net from another. In various embodiments, the characterization of parasitics such as R, L or C for shapes that constitute a net and the subsequent characterization of the electrical behavior such as currents, voltages, or with additional computation, current density or densities occur as a net (or shape that is part of a net) is created or modified. This characterization may occur incrementally as each net is created or modified and may occur while there is only a partial layout in some embodiments. The simulation produced terminal currents may be used as nets that connect to those terminals are created or modified. The simulation produced terminal currents may be used as one or more nets that connect to these terminals are being created or modified in some embodiments. In addition, these characterization(s) or verification(s) may occur while there is only a partial layout in some embodiments. In these embodiments, the simulation, re-simulation, characterization, or verification of the electrical parasitics may be performed in conjunction with the creation or modification of the physical design of an electronic circuit design so that any impact of a circuit component is addressed before the physical design is completed.

In some embodiments, the methods or systems for implementing electronic circuit design with IR-drop awareness comprises the process or the hardware module for characterizing one or more electrical parasitics that are associated with the physical data of the component that has been identified, determined, or updated at 104.

In some embodiments, the electrical parasitic comprises resistance, self- or coupled-inductance, or capacitance that is associated with the physical data. In the example of an interconnect segment in a physical design, the method or the system may characterize the resistance of this particular interconnect segment by using the electrical resistivity, the length of the segment, and the cross-sectional area along the segment. In some embodiments, the system monitors and tracks the relevant physical data associated with the creation or change to the design, for example the creation of a net or the widening of a wire segment in a net.

Resistance and capacitance models may be applied automatically to compute the parasitic data in some embodiments. In these embodiments, electrical parasitics may be generated interactively as physical design objects have been or are being created or modified. The set of partial design objects, including a set of one or more objects in the electronic circuit design that is interactively analyzed, may form a partial layout in some embodiments. In various embodiments, a partial layout comprises zero or more physical design objects and thus does not pass a layout versus schematic (LVS) check or verification. The results of various characterization processes or modules may be stored for use with subsequent electrical analysis processes or may additionally be displayed in parasitic form(s) in one or more embodiments.

In some embodiments, the characterization of electrical parasitics associated with physical data may be done with a two stage approach. This process begins with the selection a particular net or partial net. In the first stage, the process identifies where along that net that a geometric description should be created. The geometric descriptions may include wire widths and spacings, conductor and ILD (inter layer dielectrics) thicknesses, or thickness of barrier materials. A common description may be created and provided via an API (application programming interface.) The second stage may include one or more components that may translate, transform, convert, or map (hereinafter "map") the geometric description to an equivalent parasitic value such as a resistance, capacitance or inductance. This translation, transformation, conversion, or mapping (hereinafter "mapping") may be done with mathematical algorithms or models that are often referred to as parasitic extraction. The models may be created through the use of semi-empirical methods that combine models or knowledge of the underlying physics with data provided by various solver(s), simulator(s), or a combination thereof. In some cases, the mapping for capacitance may also be done with a solver.

In some embodiments, the second stage may use parasitic extraction for some nets and a field solver for other nets. In some embodiments, the second stage may use a combination of parasitic extraction for, for example, resistance(s) and a field solver for, for example, capacitance(s) on the same net. In some embodiments, the characterization of electrical parasitics may be performed with extraction tools that map geometric dimensions and patterns to corresponding parasitics such as R, L, or C.

The method or the system may further comprise the process or the hardware module for characterizing one or more electrical characteristics that are associated with the one or more electrical parasitics or the physical data of the component at 106 in some embodiments. In one or more embodiments, the methods or systems for implementing electronic circuit design with IR-drop awareness comprises the process or the hardware module for storing the one or more electrical characteristics that are associated with the physical data of the component at 108.

In one or more embodiments, the characterization of electrical parasitics, such as but not limited to various types of R, L, or C for one or more shapes that constitute a net, and the subsequent characterization of the electrical behavior or characteristic(s), such as but not limited to various types of currents, voltages, or current densities, as well as the checking or verification occur as a single net (or one or more shapes that are part of a net) has been created or modified but before the creation or modification of the next net or one or more shapes that are part of the next net. These characterizations or verification may also occur incrementally as a net is being created or modified in some embodiments. The simulation produced terminal currents may be used as one or more nets that connect to these terminals are being created or modified in some embodiments. In addition, these characterizations or verification may occur while there is only a partial layout in some embodiments. In these embodiments, the simulation, re-simulation, characterization, or verification of the electronic circuit design may be performed in conjunction with the creation or modification of the physical design of an electronic circuit design so that any impact of a circuit component is addressed before the physical design is completed.

FIG. 1B illustrates a top level diagram for implementing various embodiments of the methods or systems for implementing electronic circuit design with IR-drop awareness. In one or more embodiments, the methods or systems for implementing electronic circuit design with IR-drop awareness comprises the process or the hardware module for identifying, determining, or updating the physical data of a component of an electronic circuit design at 152 via a terminal, a work station, a computing node, or a server 100. In some embodiments, the methods or systems for implementing electronic circuit design with IR-drop awareness comprises the process or the hardware module for characterizing one or more electrical parasitics that are associated with the physical data of the component that has been identified, determined, or updated at 154.

The method or the system may further comprise the process or the hardware module for characterizing one or more electrical characteristics that are associated with the one or more electrical parasitics or the physical data of the component at 156 in some embodiments. In one or more embodiments, the methods or systems for implementing electronic circuit design with IR-drop awareness comprises the process or the hardware module for displaying the one or more electrical characteristics that are associated with the physical data of the component on a display apparatus at 108. For example, the method or the hardware module may graphically or textually display the one or more electrical characteristics in a browser window or pane or a graphical display area of a layout editor or a schematic editor of an electronic circuit design tool in some embodiments.

FIG. 2 illustrates a more detailed diagram for the method or system for implementing electronic circuit design with IR-drop awareness and some detailed information about the process or module for characterizing one or more electrical characteristics that are associated with electrical parasitics in some embodiments. In one or more embodiments, the methods or systems for implementing electronic circuit design with IR-drop awareness comprises the process or the hardware module for identifying, determining, or updating the physical data of a component of an electronic circuit design at 202 via a terminal, a work station, a computing node, or a server 200. In some embodiments, the methods or systems for implementing electronic circuit design with IR-drop awareness comprises the process or the hardware module for characterizing one or more electrical parasitics that are associated with the physical data of the component that has been identified, determined, or updated at 204.

The method or the system may further comprise the process or the hardware module for characterizing one or more electrical characteristics that are associated with the one or more electrical parasitics or the physical data of the component at 206 in some embodiments. In one or more embodiments, the methods or systems for implementing electronic circuit design with IR-drop awareness comprises the process or the hardware module for identifying or determining one or more IR-drop related constraints that are associated with the one or more electrical characteristics at 208. At 210, the methods or systems for implementing electronic circuit design with IR-drop awareness comprises the process or the hardware module for ensuring correctness of the physical data of the component or other data that are related to the one or more IR-drop related constraints.

In one or more embodiments, the process or hardware module 206 for characterizing one or more electrical characteristics that are associated with the one or more electrical parasitics and the physical data of the component comprises identifying or determining electrical data, such as electrical current(s) by using, for example, a simulator at 212. For example, the process or hardware module may identify peak current(s), DC current(s), or average current(s) for one or more device terminals related to or interconnected with the component in some embodiments. At 214, the process or hardware module 206 may further comprise using a solver such as a linear matrix solver or a non-linear solver to solve for other electrical data based at least in part upon the electrical data identified or determined at 212 in one or more embodiments. In some embodiments, the electrical parasitic data associated with the physical data is provided to a matrix solver for static or transient analysis. The matrix solver is run to produce voltage and current data for device and interconnect components of the design. In some embodiments, the method or system comprises a flow where the simulator or solver is invoked after a single net has been created or modified. In some embodiments, the other electrical data comprise, for example but not limited to, various types of current(s), voltage at various points in the electronic circuit design, or current densities through, for example, various interconnect(s) or via(s).

Figure 3:
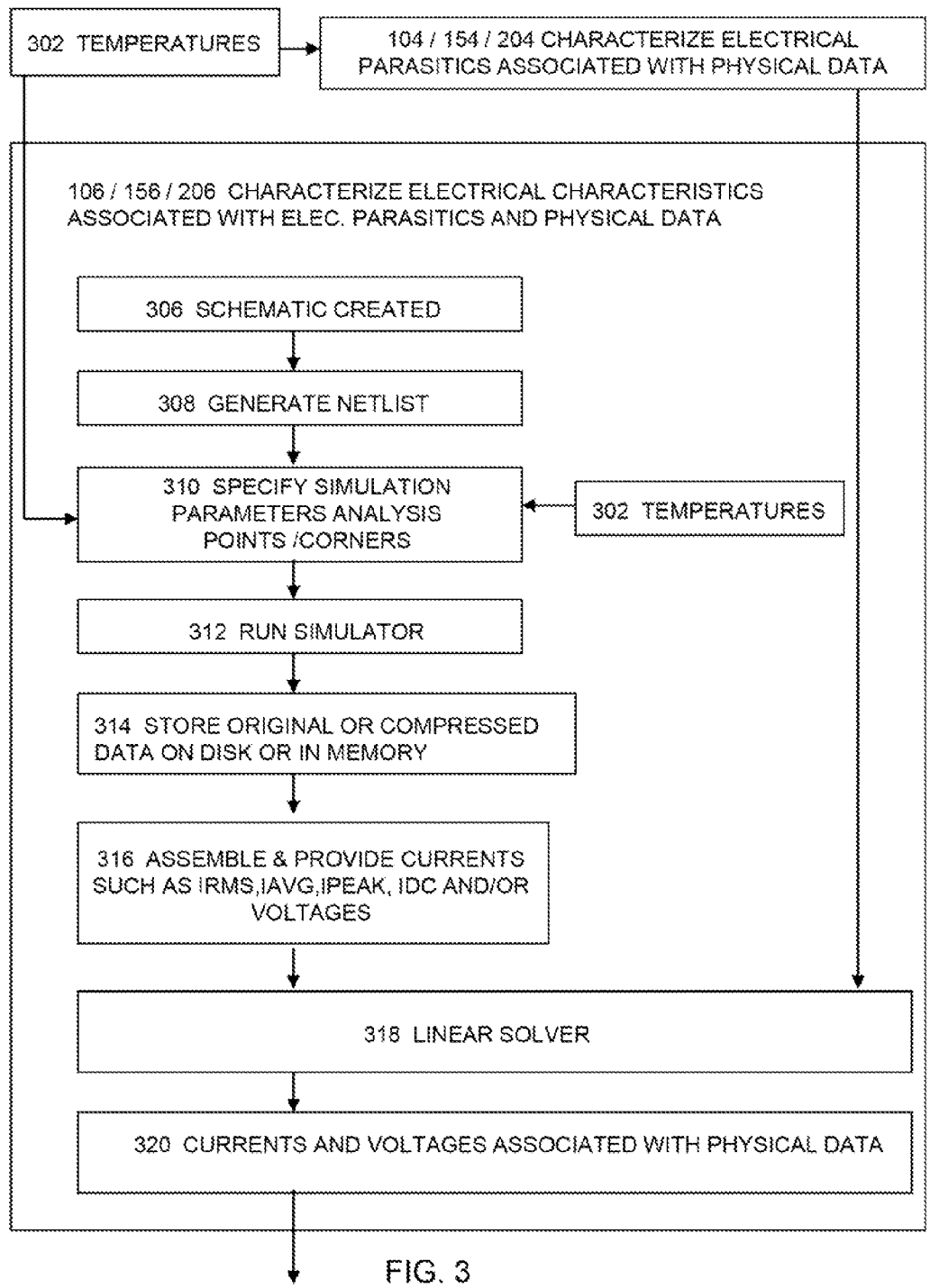
FIG. 3 illustrates more details for the process or module for characterizing one or more electrical characteristics that are associated with one or more electrical parasitics in some embodiments.

FIG. 3 illustrates more details for the process or module for characterizing one or more electrical characteristics that are associated with one or more electrical parasitics in some embodiments. In one or more embodiments, the process or the hardware module for characterizing one or more electrical characteristics that are associated with one or more electrical parasitics (106, 156, or 206) comprises the process or hardware module for identifying or creating a schematic for at least a portion of the electronic circuit design including the component at 306. In one or more embodiments, the process or the hardware module for characterizing one or more electrical characteristics that are associated with one or more electrical parasitics comprises the process or hardware module for generating a netlist based on the identified or created schematic at 308. In these embodiments, the process or the hardware module may further specify, identify, or determine one or more simulation parameters or one or more analysis points or corners at 310.

In some embodiments, the process or the hardware module may further identify or determine one or more temperatures at 302. In these embodiments, the one or more temperatures may be forwarded into the process or hardware module 310 as a part of the specification, identification, or determination of the one or more simulation parameters or one or more analysis points or corners. The process or module may further provide the one or more temperatures (302) to the process or module for characterizing one or more electrical parasitics that are associated with the physical data of the component (104, 154, or 204) in one or more embodiments. At 312, the process or the hardware may further comprise performing one or more simulations based at least in part upon the one or more simulation parameters or one or more analysis points or corners by running one or more simulators in one or more embodiments. At 314, the process or module may further comprise persistently or temporarily storing the original simulation data or a compressed version of the simulation data on a computer readable storage medium such as one or more blocks of computer memory in some embodiments.

At 316, the process or the hardware module for characterizing one or more electrical characteristics that are associated with one or more electrical parasitics comprises the process or hardware module for assembling and providing various electrical data that have been determined at 312 or in one or more previous steps for the component and at least a portion of the electronic circuit design related to the component to a solver (318) in one or more embodiments. For example, the process or module may assemble and provide the RMS (Root Mean Square) current(s), the average current(s), the peak current(s), the DC current(s), or various voltages at various points in the at least a portion of the electronic circuit design in some embodiments. In some embodiments, the process or module assembles and provides the electrical data to a linear matrix solver (318) to solve the at least a portion of the electronic circuit design. In some other embodiments, the solver comprises one or more non-linear solvers (318). In some embodiments, the process or the hardware module uses the solver (318) to solve for various electrical data 320 that comprise, for example but not limited to, various types of current(s) or various voltages that are associated with the physical data. The one or more electrical parasitics that have been characterized at 104, 154, or 204 may also be forwarded to the solver 318 to solve for various electrical data (320) in one or more embodiments.

Figure 4:
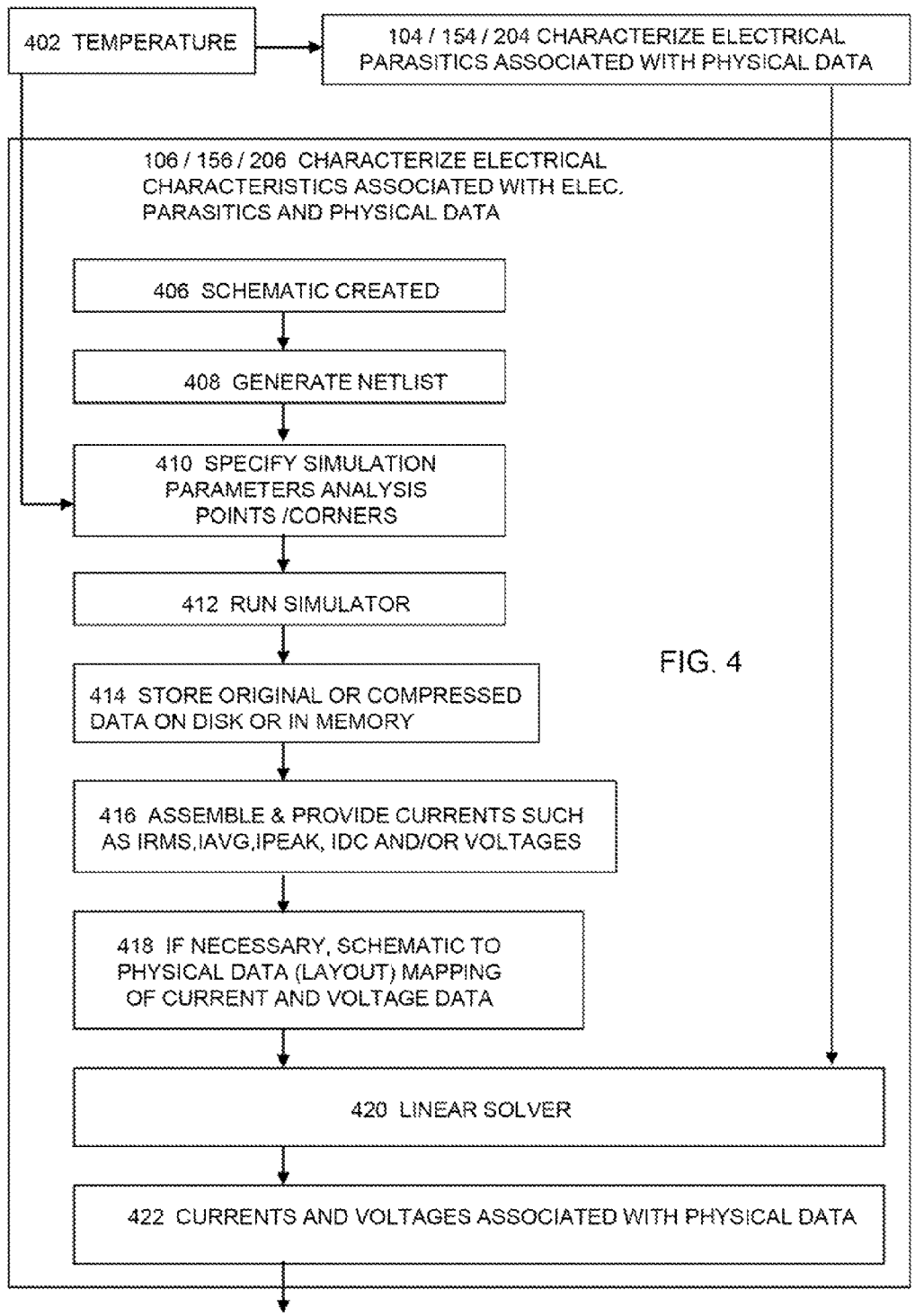
FIG. 4 illustrates more details for the process or module for characterizing one or more electrical parasitics associated with the physical data and for characterizing one or more electrical characteristics that are associated with one or more electrical parasitics in some embodiments.

FIG. 4 illustrates more details for the process or module for characterizing one or more electrical parasitics associated with the physical data and for characterizing one or more electrical characteristics that are associated with one or more electrical parasitics in some embodiments. In one or more embodiments, the process or the hardware module for characterizing one or more electrical characteristics that are associated with one or more electrical parasitics (106, 156, or 206) comprises the process or hardware module for identifying or creating a schematic for at least a portion of the electronic circuit design including the component at 406. In one or more embodiments, the process or the hardware module for characterizing one or more electrical characteristics that are associated with one or more electrical parasitics comprises the process or hardware module for generating a netlist based on the identified or created schematic at 408. In these embodiments, the process or the hardware module may further specify, identify, or determine one or more simulation parameters or one or more analysis points or corners at 410.

In some embodiments, the process or the hardware module may further identify or determine one or more temperatures at 402. In these embodiments, the one or more temperatures may be forwarded into the process or hardware module 410 as a part of the specification, identification, or determination of the one or more simulation parameters or one or more analysis points or corners. The process or module may further provide the one or more temperatures (402) to the process or module for characterizing one or more electrical parasitics that are associated with the physical data of the component (104, 154, or 204) in one or more embodiments. At 412, the process or the hardware may further comprise performing one or more simulations based at least in part upon the one or more simulation parameters or one or more analysis points or corners by running one or more simulators in one or more embodiments. At 414, the process or module may further comprise persistently or temporarily storing the original simulation data or a compressed version of the simulation data on a computer readable storage medium such as one or more blocks of computer memory in some embodiments.

At 416, the process or the hardware module for characterizing one or more electrical characteristics that are associated with one or more electrical parasitics comprises the process or hardware module for assembling and providing various electrical data that have been determined at 412 or in one or more previous steps for the component and at least a portion of the electronic circuit design related to the component to a solver (420) in one or more embodiments. At 418, the process or the hardware module may further optionally comprise the process or module for mapping the one or more electrical characteristics between the schematic design and the physical design of the at least a portion of the electronic circuit design in one or more embodiments. For example, the process or module may assemble and provide the RMS (Root Mean Square) current(s), the average current(s), the peak current(s), the DC current(s), or various voltages at various points in the at least a portion of the electronic circuit design in some embodiments. In some embodiments, the process or module assembles and provides the electrical data to a linear matrix solver (420) to solve the at least a portion of the electronic circuit design. In some other embodiments, the solver comprises one or more non-linear solvers (420). In some embodiments, the process or the hardware module uses the solver (420) to solve for various electrical data 422 that comprise, for example but not limited to, various types of current(s) or various voltages that are associated with the physical data. The one or more electrical parasitics that have been characterized at 104, 154, or 204 may also be forwarded to the solver 420 to solve for various electrical data (422) in one or more embodiments.

Figure 5:
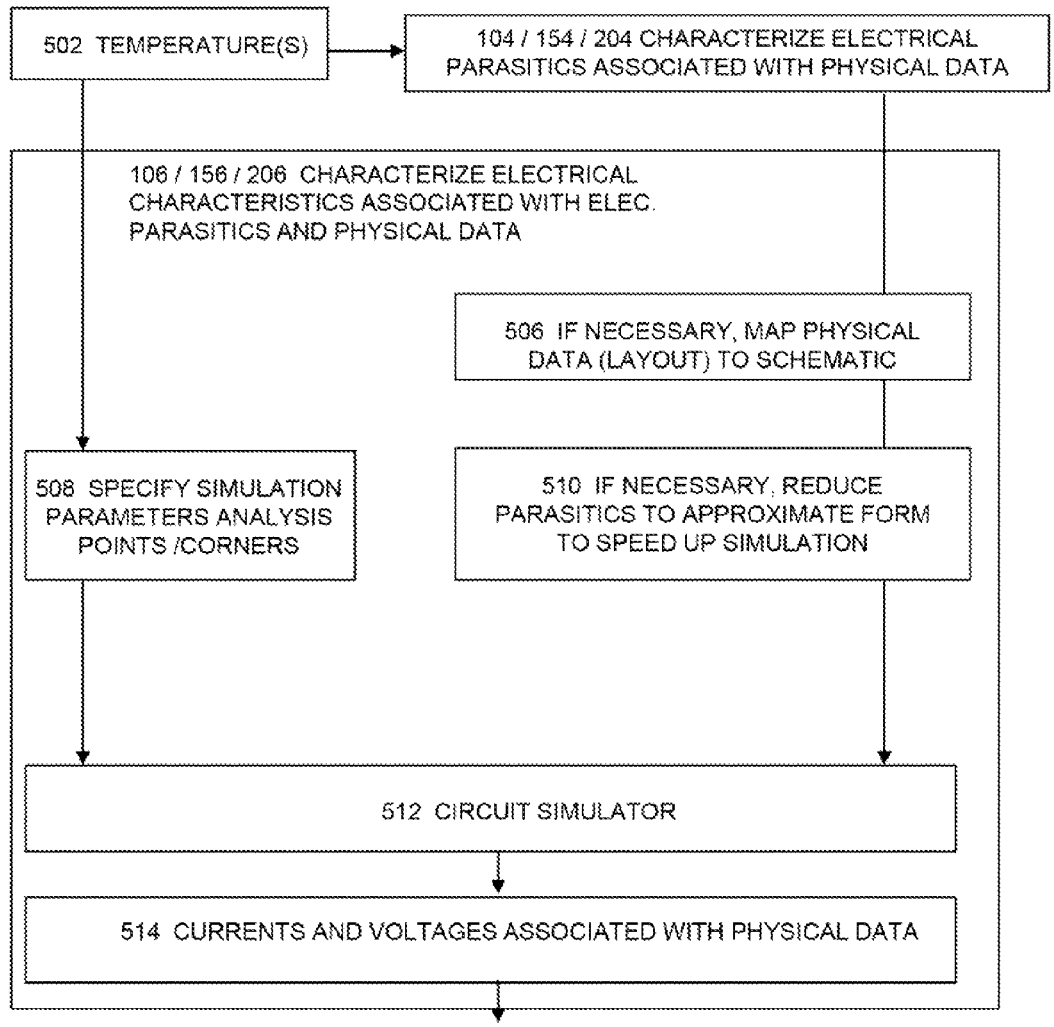
FIG. 5 illustrates more details for the process or module for characterizing one or more electrical characteristics that associated with the physical data and for characterizing one or more are electrical characteristics that are associated with one or more electrical parasitics and the physical data in some embodiments.

FIG. 5 illustrates more details for the process or module for characterizing one or more electrical characteristics that associated with the physical data and for characterizing one or more are electrical characteristics that are associated with one or more electrical parasitics and the physical data in some embodiments. In one or more embodiments, the process or the hardware module for characterizing one or more electrical characteristics that are associated with one or more electrical parasitics (106, 156, or 206) comprises the process or hardware module for specifying, identifying, or determining one or more simulation parameters or one or more analysis points or corners at 508.

In some embodiments, the process or the hardware module may further identify or determine one or more temperatures at 502. In these embodiments, the one or more temperatures may be forwarded into the process or hardware module 508 as a part of the specification, identification, or determination of the one or more simulation parameters or one or more analysis points or corners. In some embodiments, the one or more temperatures (502) may also be forwarded to the process or module of 104, 154, or 204 for characterizing one or more electrical parasitics that are associated with the physical data. In these embodiments, the characterized one or more electrical parasitics are forwarded to the circuit simulator (512) for the performance of one or more simulations. At 506, the process or the hardware module may further optionally comprise the process or module for mapping the one or more electrical characteristics between the schematic design and the physical design of the at least a portion of the electronic circuit design in one or more embodiments.

At 510, the process or the hardware module may further comprise the process or module for reducing the total number of parasitics to speed up the simulation in one or more embodiments. At 512, the process or the hardware may further comprise performing one or more simulations based at least in part upon the one or more simulation parameters or one or more analysis points or corners by running one or more simulators to solve for one or more electrical characteristics (514) in one or more embodiments. In some embodiments, the one or more electrical characteristics may comprise one or more currents or one or more voltages that are associated with the physical data of the component.

In one or more embodiments, the characterization of parasitics such as but not limited to various types of R, L or C for shapes that constitute a net and the subsequent characterization of the electrical behavior or characteristic(s), such as but not limited to various types of currents, voltages, or current densities occur as a net (or one or more shapes that are part of a net) is created or modified but before the creation or modification of the next net or one or more shapes that are part of the next net. This characterization may occur incrementally as each net is being created or modified and may occur while there is only a partial layout in some embodiments. The simulation produced terminal currents may be used as one or more nets that connect to these terminals are being created or modified in some embodiments.

Figure 6A:
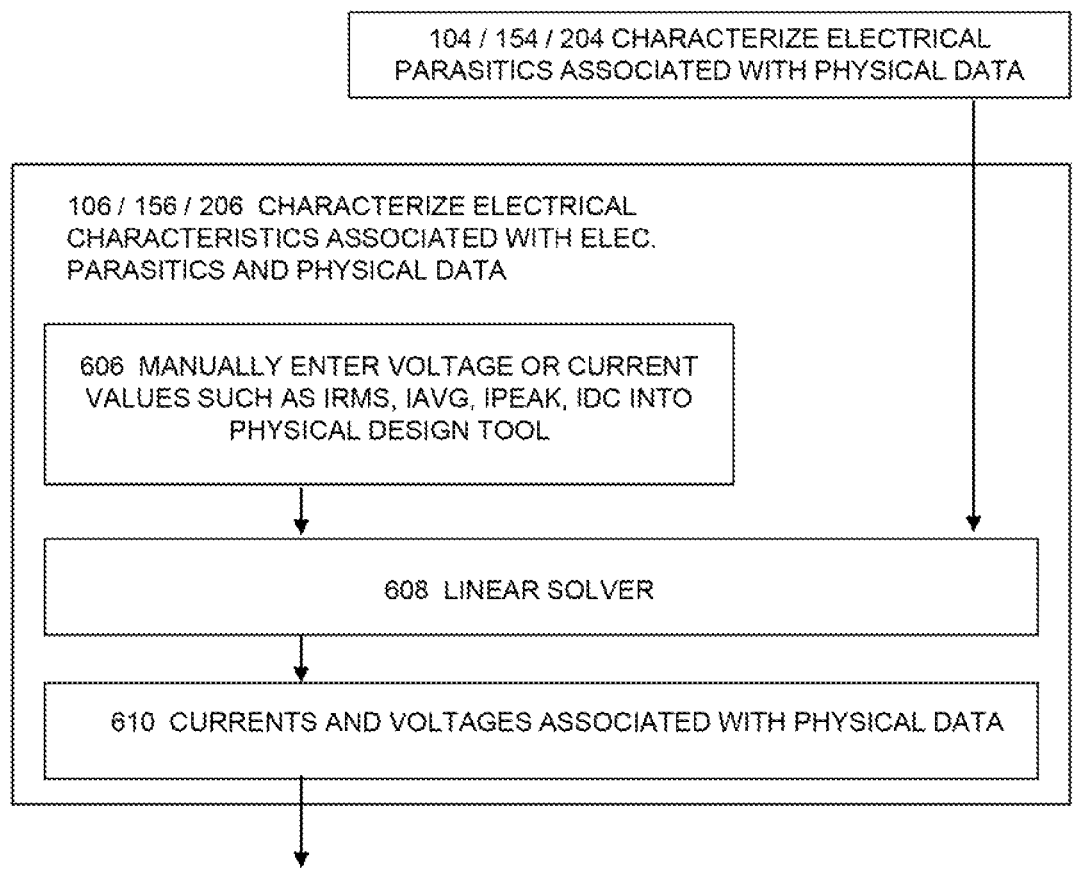
FIGS. 6A-B illustrate more details for the process or module for implementing electronic circuit design with IR-drop awareness in some embodiments.

FIG. 6A illustrates more details for the process or module for implementing electronic circuit design with IR-drop awareness in one or more embodiments. More particularly, FIG. 6A illustrates more details for the process or module for characterizing one or more electrical characteristics that are associated with one or more electrical parasitics and the physical data of the component in one or more embodiments. In some embodiments, the process or module for characterizing one or more electrical characteristics that are associated with one or more electrical parasitics and the physical data of the component may comprise manually entering or inputting one or more electrical characteristics into a physical design tool (for example, a floor-planning tool, a placement or a routing tool, a layout editor, a layout simulator, or a physical verification tool, etc.) at 606. In some embodiments, the one or more manually entered electrical characteristics comprise, for example but not limited to, various types of currents, such as RMS current(s), peak current(s), average current(s), or DC current(s), or various types of voltages.

In one or more embodiments, the process or module for characterizing one or more electrical characteristics that are associated with one or more electrical parasitics and the physical data of the component may further comprising forwarding the manually entered one or more electrical characteristics to a solver (608) that solves the component and at least a portion of the electronic circuit design related to the component for other electrical characteristics that are associated with the physical data of the component. In some embodiments, these other electrical characteristics comprise, for example but not limited to, various types of current(s), voltage at various points in the electronic circuit design, or current densities through, for example, various interconnect(s) or via(s).

In one or more embodiments, the characterization of parasitics such as but not limited to various types of R, L, or C for one or more shapes that constitute a net and the subsequent characterization of the electrical behavior or characteristic(s), such as but not limited to various types of currents, voltages, or current densities, as well as the constraint verification occur as a single net (or one or more shapes that are part of a net) has been created or modified but before the creation or modification of the next net or one or more shapes that are part of the next net. These characterizations or verification may also occur incrementally as a net is being created or modified in some embodiments. The simulation produced terminal currents may be used as one or more nets that connect to these terminals are being created or modified in some embodiments. In addition, these characterizations or verification may occur while there is only a partial layout in some embodiments. In these embodiments, the simulation, re-simulation, characterization, or verification of the electrical parasitics may be performed in conjunction with the creation or modification of the physical design of an electronic circuit design so that any impact of a circuit component is addressed before the physical design is completed.

Figure 6B:
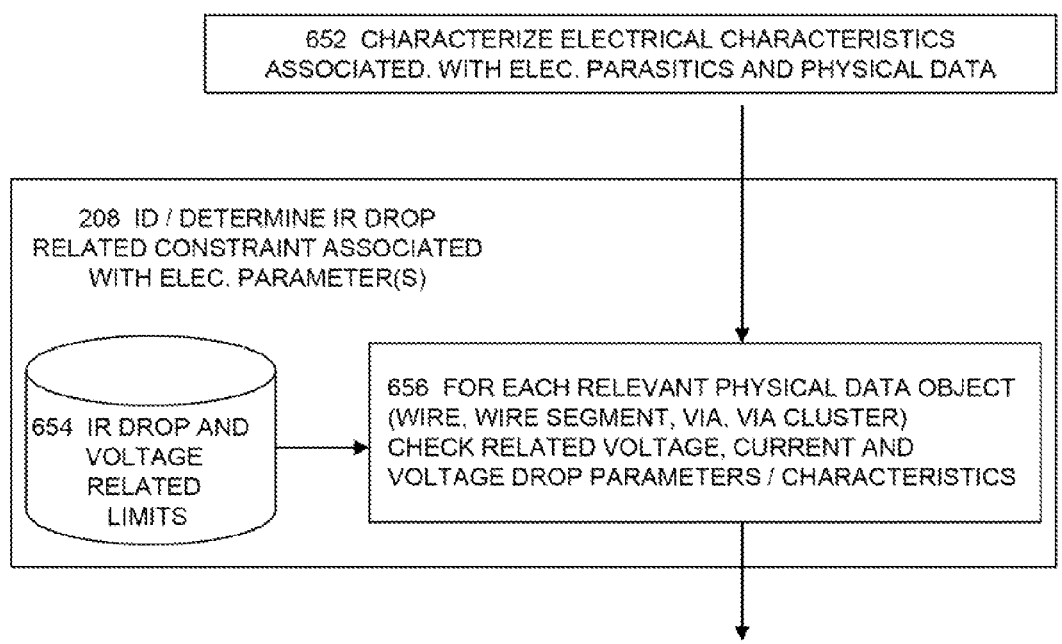

FIG. 6B illustrates more details for the process or module for implementing electronic circuit design with IR-drop awareness in some embodiments. More particularly, FIG. 6B illustrates more details for the process or module for identifying or determining one or more IR-drop related constraints that are associated with the one or more electrical parameters in one or more embodiments. In some embodiments, the process or module for identifying or determining one or more IR-drop related constraints may comprise the process or module for checking an electrical characteristic for each of one or more relevant physical data objects at 656. In some embodiments, the one or more relevant physical data objects comprise, for example but not limited to, one or more wires, one or more segments of one or more wires, one or more vias, one or more via clusters, or one or more via overlaps that are relevant to the physical data of the component. In some embodiments, the electrical characteristic comprises one or more related voltages, one or more currents, or one or more voltage drop parameters or characteristics. In some embodiments, the process or module for checking the electrical characteristic is performed based at least in part upon one or more limits (654) that are related to IR drop or voltages.

Figure 7:
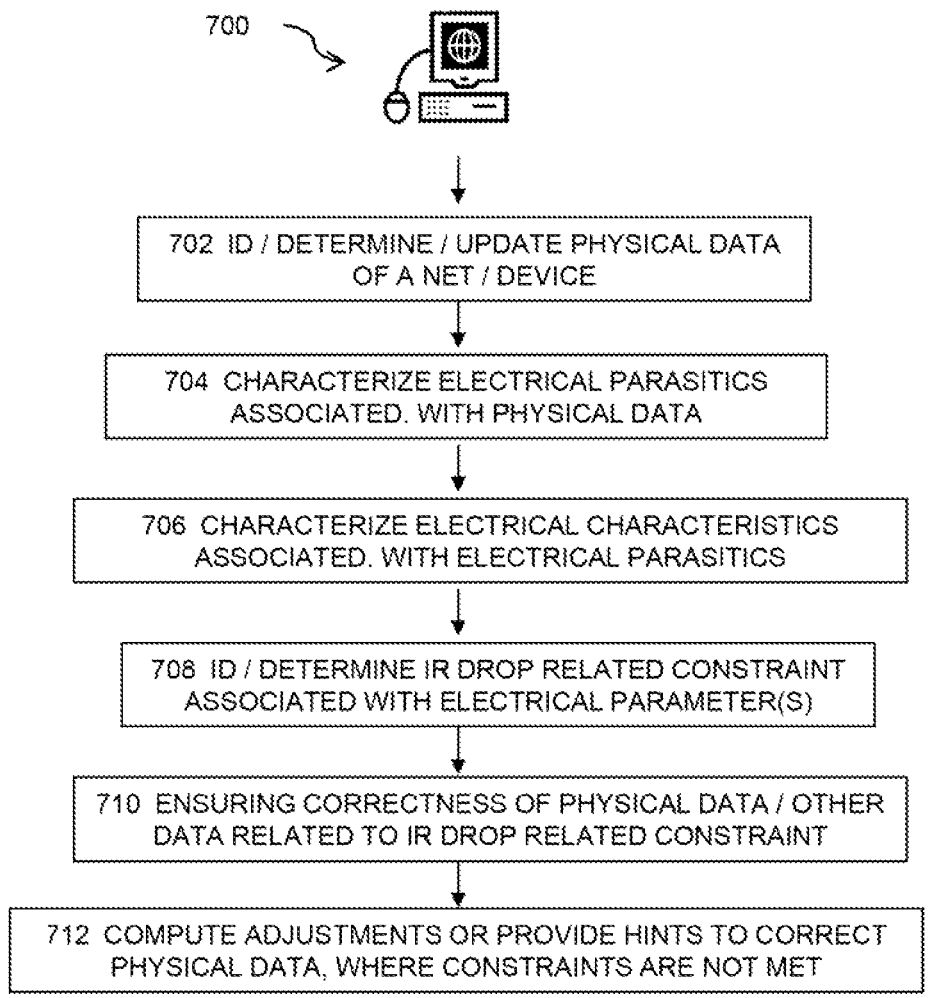
FIG. 7 illustrates a more detailed flow diagram for the method or system for implementing electronic circuit designs with IR-drop awareness.

FIG. 7 illustrates a more detailed flow diagram for the method or system for implementing electronic circuit designs with IR-drop awareness in some embodiments. In one or more embodiments, the methods or systems for implementing electronic circuit design with IR-drop awareness comprises the process or the hardware module for identifying, determining, or updating the physical data of a component of an electronic circuit design at 702 via a terminal, a work station, a computing node, or a server 700. In some embodiments, the methods or systems for implementing electronic circuit design with IR-drop awareness comprises the process or the hardware module for characterizing one or more electrical parasitics that are associated with the physical data of the component that has been identified, determined, or updated at 704.

The method or the system may further comprise the process or the hardware module for characterizing one or more electrical characteristics that are associated with the one or more electrical parasitics or the physical data of the component at 706 in some embodiments. In one or more embodiments, the methods or systems for implementing electronic circuit design with IR-drop awareness comprises the process or the hardware module for identifying or determining one or more IR-drop related constraints that are associated with the one or more electrical characteristics at 708.

At 710, the methods or systems for implementing electronic circuit design with IR-drop awareness comprise the process or the hardware module for ensuring correctness of the physical data of the component or other data that are related to the one or more IR-drop related constraints in some embodiments. At 712, the method or system may further comprise the process or hardware module for determining one or more adjustments or providing one or more hints to correct the physical data of the component in some embodiments where it is determined that at least one of the one or more IR-drop related constraints is not met.

Figure 8:
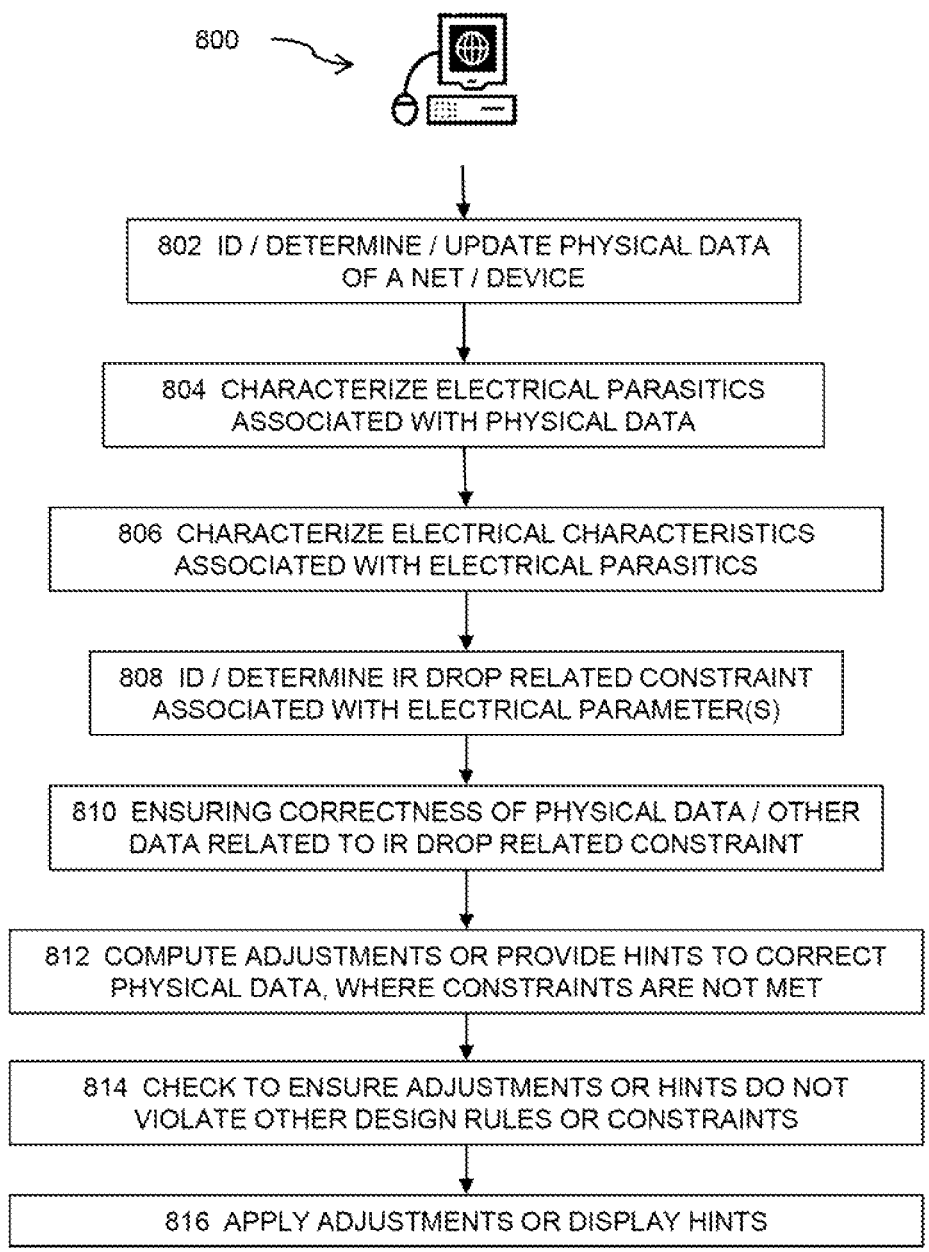
FIG. 8 illustrates a more detailed flow diagram for the method or system for implementing electronic circuit designs with IR-drop awareness.

FIG. 8 illustrates a more detailed flow diagram for the method or system for implementing electronic circuit designs with IR-drop awareness in some embodiments. In one or more embodiments, the methods or systems for implementing electronic circuit design with IR-drop awareness comprises the process or the hardware module for identifying, determining, or updating the physical data of a component of an electronic circuit design at 802 via a terminal, a work station, a computing node, or a server 800. In some embodiments, the methods or systems for implementing electronic circuit design with IR-drop awareness comprises the process or the hardware module for characterizing one or more electrical parasitics that are associated with the physical data of the component that has been identified, determined, or updated at 804.

The method or the system may further comprise the process or the hardware module for characterizing one or more electrical characteristics that are associated with the one or more electrical parasitics or the physical data of the component at 806 in some embodiments. In one or more embodiments, the methods or systems for implementing electronic circuit design with IR-drop awareness comprise the process or the hardware module for identifying or determining one or more IR-drop related constraints that are associated with the one or more electrical characteristics at 808.

At 810, the methods or systems for implementing electronic circuit design with IR-drop awareness comprises the process or the hardware module for ensuring correctness of the physical data of the component or other data that are related to the one or more IR-drop related constraints in some embodiments. At 812, the method or system may further comprise the process or hardware module for determining one or more adjustments or providing one or more hints to correct the physical data of the component in some embodiments where it is determined that at least one of the one or more IR-drop related constraints is not met.

In one or more embodiments, the method or the system may further comprise the process or module for checking to ensure that the one or more adjustments or the one or more hints do not violate one or more other requirements at 814. In some embodiments, these one or more other requirements comprise one or more design rules, one or more constraints that at least a portion of the electronic circuit design needs to satisfy, or a combination thereof. At 816, the method or the system comprises the process or module for applying at least some of the one or more adjustments to at least a part of the electronic circuit design or providing at least some of the one or more hints on a display apparatus in one or more embodiments.

Figure 9:
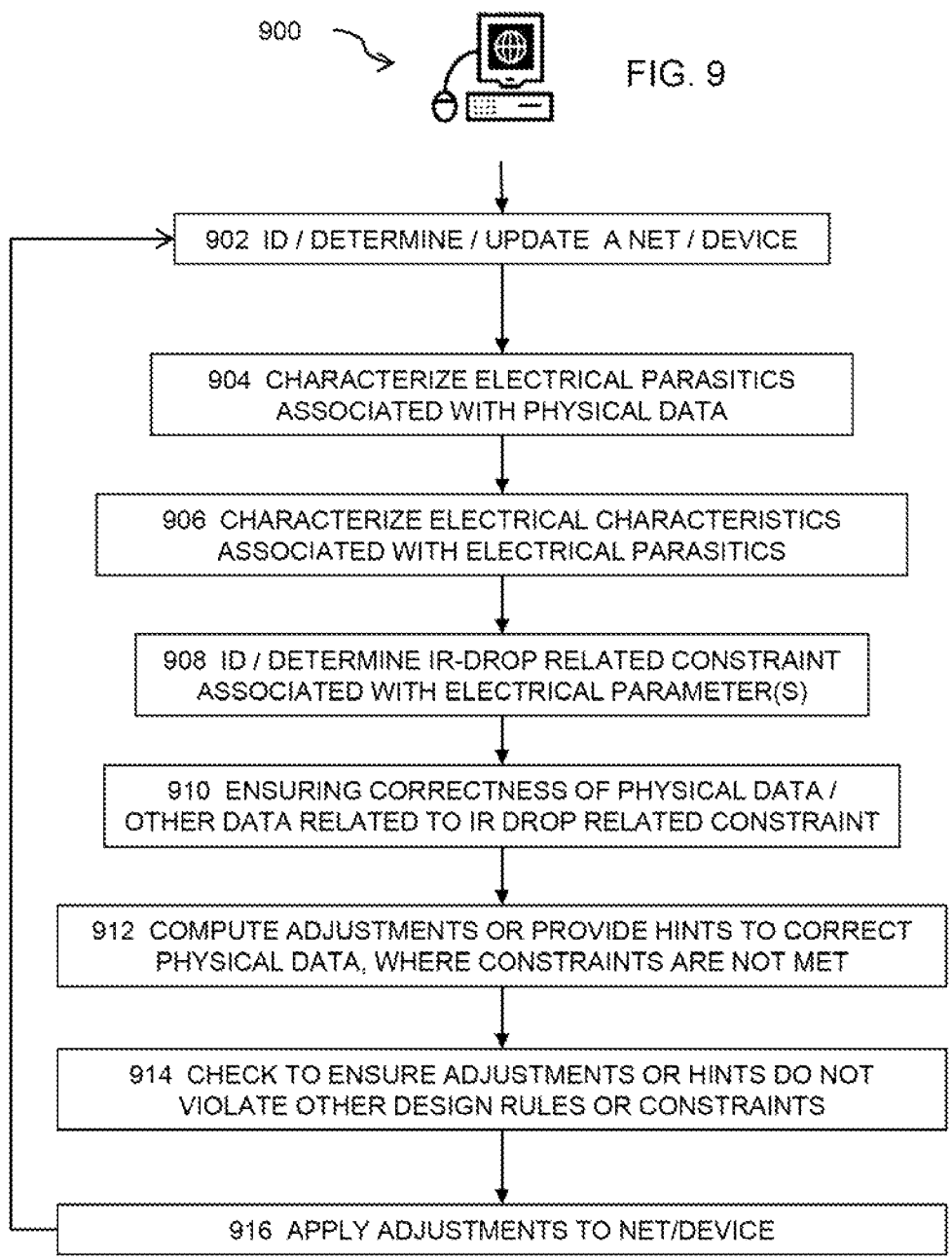
FIG. 9 illustrates a more detailed flow diagram for the method or system for implementing electronic circuit designs with IR-drop awareness.

FIG. 9 illustrates a more detailed flow diagram for the method or system for implementing electronic circuit designs with IR-drop awareness in some embodiments. In one or more embodiments, the methods or systems for implementing electronic circuit design with IR-drop awareness comprises the process or the hardware module for identifying, determining, or updating the physical data of a component of an electronic circuit design at 902 via a terminal, a work station, a computing node, or a server 900. In some embodiments, the methods or systems for implementing electronic circuit design with IR-drop awareness comprises the process or the hardware module for characterizing one or more electrical parasitics that are associated with the physical data of the component that has been identified, determined, or updated at 904.

The method or the system may further comprise the process or the hardware module for characterizing one or more electrical characteristics that are associated with the one or more electrical parasitics or the physical data of the component at 906 in some embodiments. In one or more embodiments, the methods or systems for implementing electronic circuit design with IR-drop awareness comprise the process or the hardware module for identifying or determining one or more IR-drop related constraints that are associated with the one or more electrical characteristics at 908.

At 910, the methods or systems for implementing electronic circuit design with IR-drop awareness comprises the process or the hardware module for ensuring correctness of the physical data of the component or other data that are related to the one or more IR-drop related constraints in some embodiments. At 912, the method or system may further comprise the process or hardware module for determining one or more adjustments or providing one or more hints to correct the physical data of the component in some embodiments where it is determined that at least one of the one or more IR-drop related constraints is not met.

In one or more embodiments, the method or the system may further comprise the process or module for checking to ensure that the one or more adjustments or the one or more hints do not violate one or more other requirements at 914. In some embodiments, these one or more other requirements comprise one or more design rules, one or more constraints that at least a portion of the electronic circuit design needs to satisfy, or a combination thereof. At 916, the method or the system comprises the process or module for applying at least some of the one or more adjustments to at least a part of the electronic circuit design or providing at least some of the one or more hints on a display apparatus in one or more embodiments. At 916, the method or the system may further loop back to 902 to perform the process or invoke the module for identifying, determining, or updating another component from the electronic circuit design in one or more embodiments. The method or the system then repeats the aforementioned processes until all the interested components have been processed or until a predetermined threshold for the iterative process has been reached in one or more embodiments.

System Architecture Overview

Figure 10:
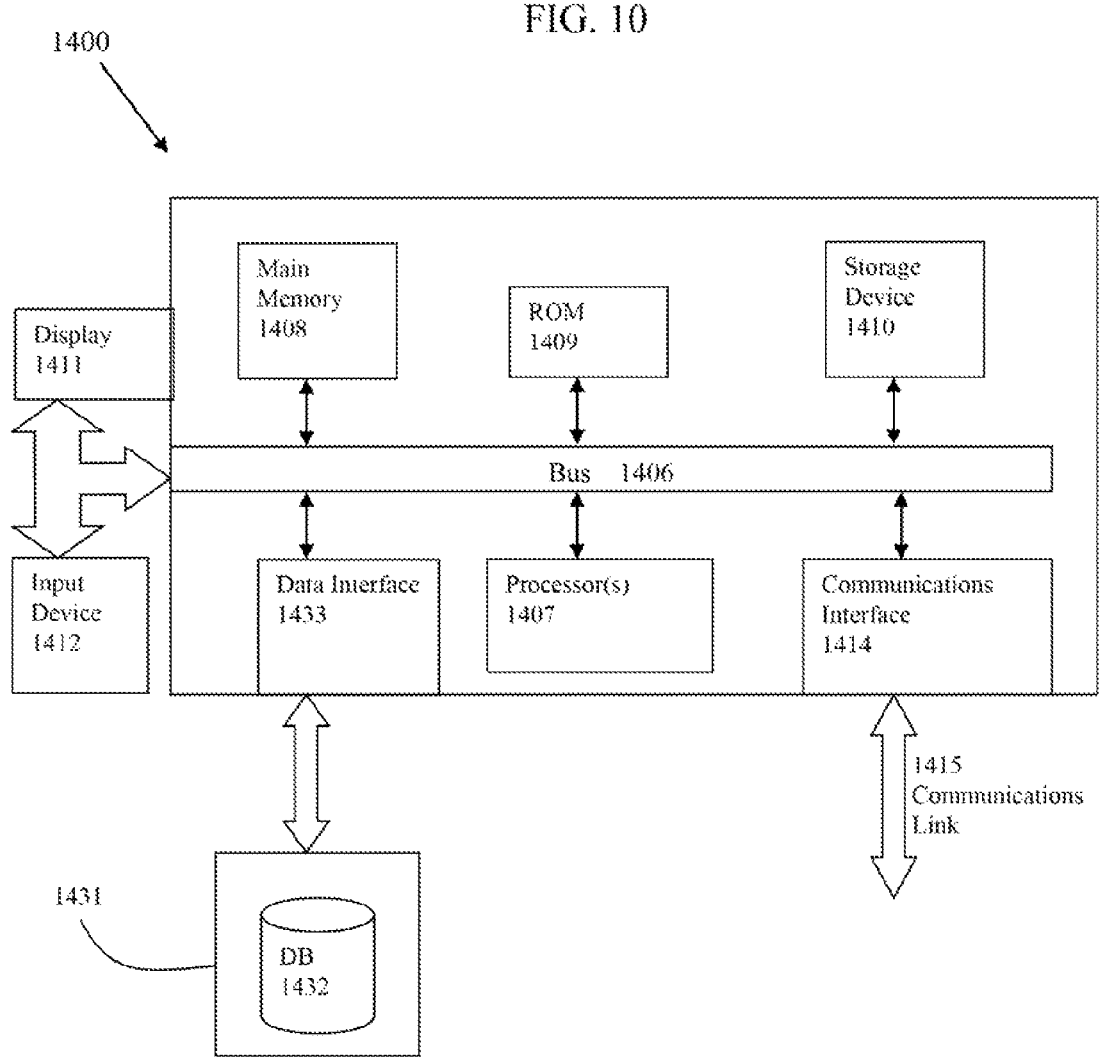
FIG. 10 depicts a computerized system on which a method for timing closure with concurrent process models may be implemented.

FIG. 10 illustrates a block diagram of an illustrative computing system 1400 suitable for implementing some embodiments of the method or system for implementing electronic circuit designs with IR-drop awareness as described in the preceding paragraphs with reference to various figures. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control (not shown).

According to one embodiment, computer system 1400 performs specific operations by one or more processor or processor cores 1407 executing one or more sequences of one or more instructions contained in system memory 1408. Such instructions may be read into system memory 1408 from another computer readable/usable storage medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 1407, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof.

The term "computer readable storage medium" or "computer usable storage medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer may read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, e.g., application code, through communication link 1415 and communication interface 1414. Received program code may be executed by processor 1407 as it is received, and/or stored in disk drive 1410, or other non-volatile storage for later execution. In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals that include data streams representing various types of signal information, e.g., instructions, messages and data. In embodiments of the invention, the functions of the data interface 1433 may be performed by the communication interface 1414.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing an electronic circuit design with IR-drop awareness, comprising:
    prior to completing an incomplete net of the electronic circuit design, using at least one processor to perform a process, the process comprising:
        identifying, determining, or updating physical data of a component that is situated along the incomplete net in an incomplete physical design of the electronic circuit design;
        characterizing an electrical parasitic that is associated with the physical data of the component by at least assembling one or more pieces of electric current information or one or more voltages in a schematic domain, rather than in a physical domain to which the incomplete physical design belongs; and
        characterizing an electrical characteristic that is associated with the electrical parasitic and the physical data of the component while the component is being added or modified along the incomplete net of the electronic circuit design.

2. The computer implemented method of claim 1, the process further comprising:
    displaying the electrical characteristic associated with the physical data of the component or storing the electrical characteristic in a non-transitory computer readable storage medium.

3. The computer implemented method of claim 1, the process further comprising:
    identifying or determining an IR-drop related constraint that is associated with the electrical characteristic.

4. The computer implemented method of claim 3, the process further comprising:
    ensuring correctness of the physical data or other data that are related to the IR-drop related constraint.

5. The computer implemented method of claim 4, the process further comprising:
    determining an adjustment to the physical data or to the component based at least in part upon the IR-drop related constraint.

6. The computer implemented method of claim 5, the process further comprising:
    determining whether the adjustment causes one or more violations of one or more design rules or one or more constraints other than the IR-drop related constraint.

7. The computer implemented method of claim 5, the process further comprising:
    displaying a hint, which is based at least in part upon the adjustment, on a display apparatus or applying the adjustment to the physical data or to the component.

8. The computer implemented method of claim 7, the process further comprising:
    iteratively determining whether the IR-drop related constraint or another IR-drop related constraint is met based at least in part upon an identification, determination, or update of the physical data after applying the adjustment to the physical data or the component.

9. The computer implemented method of claim 3, wherein the act of identifying or determining the IR-drop related constraint comprises:
    checking the electrical characteristic against the IR-drop related constraint for the component based at least in part upon the electrical characteristic.

10. The computer implemented method of claim 1, wherein the act of characterizing the electrical characteristic that is associated with the electrical parasitic comprises:
    performing simulation on the electronic circuit design to solve for one or more currents for the component; and
    determining the electrical characteristic by using a solver.

11. The computer implemented method of claim 1, wherein the act of characterizing the electrical characteristic that is associated with the electrical parasitic comprises:
    identifying or generating thermal data and a schematic of the electronic circuit design;
    generating a netlist;
    specifying one or more simulation parameters or one or more analysis points or corners;
    performing a simulation to determine one or more electrical characteristics at a first level; and
    determining the electrical characteristic at a second level based at least in part upon the one or more electrical characteristics at the first level and the electrical parasitic by using a solver.

12. The computer implemented method of claim 1, the process further comprising at least one of:
    identifying thermal data for the component;
    mapping data, which correspond to the physical data of the component, at a first level to a second level of the electronic circuit design;
    reducing the electrical parasitic; and
    specifying one or more simulation parameters or one or more analysis points or corners.

13. The computer implemented method of claim 1, wherein the act of characterizing the electrical characteristic that is associated with the electrical parasitic comprises:
    mapping data, which correspond to the physical data of the component, at a second level to a first level of the electronic circuit design;

reducing the electrical parasitic to an approximate form;
specifying one or more simulation parameters or one or more analysis points or corners; and
performing a simulation at the second level to determine the electrical characteristic.

14. The computer implemented method of claim 1, the process further comprising:
identifying, determining, or updating the electrical characteristic, wherein the act of identifying, determining, or updating the electrical characteristic comprises:
receiving a user-provided electrical characteristic at a second level from a user; and
identifying, determining, or updating the electrical characteristic by performing a simulation based at least in part upon the user-provided electrical characteristic.

15. The computer implemented method of claim 1, the process further comprising:
performing simulation or re-simulation for the electronic circuit design based at least in part upon the electrical parasitic before the incomplete layout of the electronic circuit design is completed.

16. The computer implemented method of claim 15, the process further comprising:
matching a simulation parameter for the simulation or re-simulation with an extraction parameter that is used for extraction on the electronic circuit design;
stitching a form of the electrical parasitic into a schematic design of the electronic circuit design; and
identifying one or more parasitic-aware electrical characteristics for one or more electrical analyses.

17. The computer implemented method of claim 1, wherein the incomplete layout of the electronic circuit design does not pass a layout versus schematic check or verification.

18. The computer implemented method of claim 1, in which the act of characterizing the electrical parasitic comprises:
identifying where along at least a particular net to create a geometric description of the component is to be created; and
mapping the geometric description to an equivalent parasitic value.

19. The computer implemented method of claim 1, the process further comprising:
identifying a violation of a design requirement for the electrical characteristic; and
determining a hint that corresponds to at least a part of the physical data to resolve the violation.

20. The computer implemented method of claim 1, the process further comprising:
mapping the electrical characteristic between a schematic design of the electronic circuit design and at least the incomplete physical design of the electronic circuit design; and
assemble the electrical characteristic, which has been mapped, and provides one or more assembled electrical characteristics to a solver to solve for at least the incomplete physical design of the electronic circuit design.

* * * * *